US008185368B2

United States Patent
Bolcato et al.

(10) Patent No.: US 8,185,368 B2
(45) Date of Patent: *May 22, 2012

(54) MIXED-DOMAIN ANALOG/RF SIMULATION (75) Inventors: Pascal Bolcato, Echirolles (FR); Remi Larcheveque, Grenoble (FR); Joel Besnard, Goncelin (FR)

(73) Assignee: Mentor Graphics Corporation, Wilsonville, OR (US)

(*) Notice: Subject to any disclaimer, the term of this patent is extended or adjusted under 35 U.S.C. 154(b) by 24 days.

This patent is subject to a terminal disclaimer.

(21) Appl. No.: 12/776,898

(22) Filed: May 10, 2010

(65) Prior Publication Data

US 2010/0223041 A1  Sep. 2, 2010

Related U.S. Application Data (63) Continuation of application No. 10/551,571, filed as application No. PCT/EP2005/052586 on Jun. 6, 2005, now Pat. No. 7,720,660.

(51) Int. Cl.
*G06F 17/50* (2006.01)

(52) U.S. Cl. ............... 703/13; 703/14; 703/15; 703/16; 716/105; 716/108; 716/111; 716/124; 716/134; 455/296; 455/118

(58) Field of Classification Search .................. 703/14, 703/2; 455/550.1; 716/113
See application file for complete search history.

(56) References Cited

U.S. PATENT DOCUMENTS

| | | | |
|---|---|---|---|
| 4,791,593 A | 12/1988 | Hennion | |
| 6,075,480 A | 6/2000 | Deliberis | |
| 6,181,754 B1 | 1/2001 | Chen | |
| 6,349,272 B1 | 2/2002 | Phillips | |
| 6,504,885 B1 | 1/2003 | Chen | |
| 6,637,018 B1 | 10/2003 | Demler | |
| 6,687,658 B1 | 2/2004 | Roychowdhury | |
| 6,778,025 B1 | 8/2004 | Leuthold | |
| 7,493,240 B1* | 2/2009 | Feng et al. | 703/2 |
| 2003/0009732 A1 | 1/2003 | Gullapalli | |
| 2003/0018459 A1 | 1/2003 | O'Riordan et al. | |
| 2003/0046045 A1* | 3/2003 | Pileggi et al. | 703/4 |
| 2003/0135354 A1 | 7/2003 | Gabele et al. | |

(Continued)

FOREIGN PATENT DOCUMENTS

WO  WO 01/88830 A1  11/2001

OTHER PUBLICATIONS

"Eldo RF," retrieved from www.mentor.com on Sep. 28, 2005, 5 pgs.

(Continued)

*Primary Examiner* — Kamini S Shah
*Assistant Examiner* — Cuong Luu
(74) *Attorney, Agent, or Firm* — Klarquist Sparkman, LLP

(57) ABSTRACT

A simulation environment is disclosed wherein both analog and RF signals are simulated in a single flow by a mixed-domain simulator. The simulator includes a simulator kernel with an analog solver and an RF solver to allow both analog- and RF-type of signals to be solved in an interrelated fashion. The simulator may also include a partitioner that divides the circuit into various RF and analog modules to be solved. User input may control the partitioning process, but the simulator may refine the partitions or generate sub-partitions to provide a higher probability of convergence.

16 Claims, 8 Drawing Sheets

U.S. PATENT DOCUMENTS

2003/0191620 A1    10/2003    Williams et al.
2003/0191869 A1    10/2003    Williams et al.
2006/0047491 A1*    3/2006    Li et al. ................ 703/14
2006/0277018 A1    12/2006    Bolcato et al.

OTHER PUBLICATIONS

"Eldo" retrieved from www.mentor.com on Sep. 28, 2005, 3 pgs.

Feldmann et al., "Computation of circuit waveform envelopes using an efficient, matrix-decomposed harmonic balance algorithm," *International Conference on Computer-Aided Design*, pp. 295-300 (1996).

International Search Report and Written Opinion for International Application No. PCT/EP2005/052586 (Jun. 6, 2005).

Jean Ravatin et al., "Full Transceiver Circuit Simulation Using VJDL-AMS," pp. 29-33, Microwave Engineering, May 2002.

Jose Luis Pino, Khalil Kalbasi, "Cosimulation Synchronous DSP Application with Analog RF Curcuit," pp. 1710-1714, 0-7803-5148-7/98 1998 IEEE.

Ngoya et al., Envelop Transient Analysis: A New Method for Transient and Steady State Analysis of Microwave Communication Circuits and Systems, *IEEE MTT-S Digest*, pp. 1365-1368 (1996).

Xin Li et al., "A Frequency Relaxation Approach for Analog/RF System-Level Simulation," pp. 842-847, 2004 ACM 1-58113-828-08/04/0006.

\* cited by examiner

MIXED-DOMAIN ANALOG/RF SIMULATION

CROSS REFERENCE TO RELATED APPLICATIONS

This is a Continuation of U.S. patent application Ser. No. 10/551,571, filed Sep. 29, 2005 now U.S. Pat. No. 7,720,660, which is a U.S. National Stage of International Application No. PCT/EP2005/052586, filed Jun. 6, 2005, both of which are hereby incorporated by reference.

FIELD OF THE INVENTION

The present invention generally relates to simulation, and more particularly to analog (time domain) and RF (time-frequency domain) simulation.

BACKGROUND

The design of an integrated circuit (IC) is an extremely complicated task and requires a structured approach. Generally, the IC design flow can be broken down into the steps of implementation and verification. Implementation usually involves the creation of a specification, an RTL model, a transistor-level model, or a gate-level netlist. Verification is usually performed by simulators that test the functionality of an IC in a software environment before creation of a physical prototype. To perform such testing, simulators predict the behavior of a system by using mathematical models of the system components. Based on the circuit signals, different types of simulators are chosen to perform the simulation, such as digital, analog, and RF simulators.

For digital simulation, the modeling begins with a software program that describes the behavior or functionality of a circuit. This software program is written in a hardware description language (HDL) that defines an algorithm to be performed with limited implementation details. Designers direct behavioral synthesis tools to generate alternate architectures by modifying constraints (such as clock period, number and type of data path elements, and desired number of clock cycles). Behavioral synthesis tools convert the HDL program into a register transfer level (RTL) description, which is used for simulation. The RTL description is used to ultimately generate a netlist that includes a list of components in the circuit and the interconnections between the components. This netlist is used to create the physical integrated circuit. Digital simulation usually relates to events where data changes on clock cycles and the logical voltage levels are limited to two or three.

Analog simulation is used for DC, AC and transient analyses and operates on a transistor-level description, which is a full netlist of the physical circuit containing detailed architectural and parasitic information. Analog behavioral languages (e.g., Verilog-AMS or VHDL-AMS) also exist and allow the user to model an analog design at a higher level of abstraction. The analog design process includes the creation of schematics, layout, and extraction resulting in the netlist used for simulation. The analog simulator (e.g., SPICE) uses the netlist as an input to formulate non-linear equations for the circuit to solve for the unknown waveform V(t). Iterative methods, such as Newton-Raphson, can be used to solve these non-linear systems of equations. For transient analysis, most analog simulators choose time points at which the system is solved in order to meet a desired accuracy criteria. Thus the basic difference between analog and digital simulators is that an analog simulator considers the voltages and currents in a circuit to be continuous quantities, rather than quantized into high/low values, as in digital. This allows analog simulators to calculate voltage and current as a function of time.

RF simulators perform both steady-state analysis and modulated steady-state analysis (also called envelope analysis). The steady state is defined as the state when all initial transients have vanished, and the circuit operates with periodic or quasi-periodic large signals. Modulated steady-state analysis is a mixed time-frequency algorithm dedicated to the simulation of circuits stimulated by (non periodic) modulated signals. It efficiently handles the modulation information carried by RF signals. A mathematical representation of modulated steady-state signal is given by the equation $$v(t) = \sum_{k=-K}^{K} V_K(t) e^{j\omega_k(t)t},$$

which includes both time aspects and frequency aspects. The output of the modulated steady-state analysis is a time-varying spectrum. Other analyses are also possible, such as the steady-state small signal analysis, steady-state noise analysis, etc. An example use of RF simulators is for RF transceivers found in mobile phones. These circuits include low noise amplifiers, mixers, filters, oscillators etc., which operate in a RF frequency range (e.g., typically from a few 100 MHz to 5 GHz).

Although a single simulator may have the capability to solve both analog and RF, the simulator has two kernels, one for each type of simulation. For example, one simulation flow needs to be performed for the analog waveforms and a separate simulation flow needs to be performed for the mixed time-frequency waveforms. Having two simulation flows for separate analog and RF reduces efficiency during verification and is difficult when developing high-speed circuits where performance is complicated.

Therefore, it is desirable to provide a mixed-domain simulation system capable of handling both analog and RF signal analysis in a single simulation flow.

SUMMARY

The present invention provides a simulation environment wherein both analog and RF signals are simulated in a single flow by a mixed-domain simulator. The simulator includes a simulator kernel with an analog solver and an RF solver to allow both analog- and RF-type of signals to be solved in an interrelated fashion. The simulator may also include a partitioner that divides the circuit into various RF and analog modules to be solved. User input may control the partitioning process, but the simulator may refine the partitions and/or generate sub-partitions to improve performance and provide a higher probability of convergence.

These features and others of the described embodiments will be more readily apparent from the following detailed description, which proceeds with reference to the accompanying drawings.

DETAILED DESCRIPTION

Figure 1:
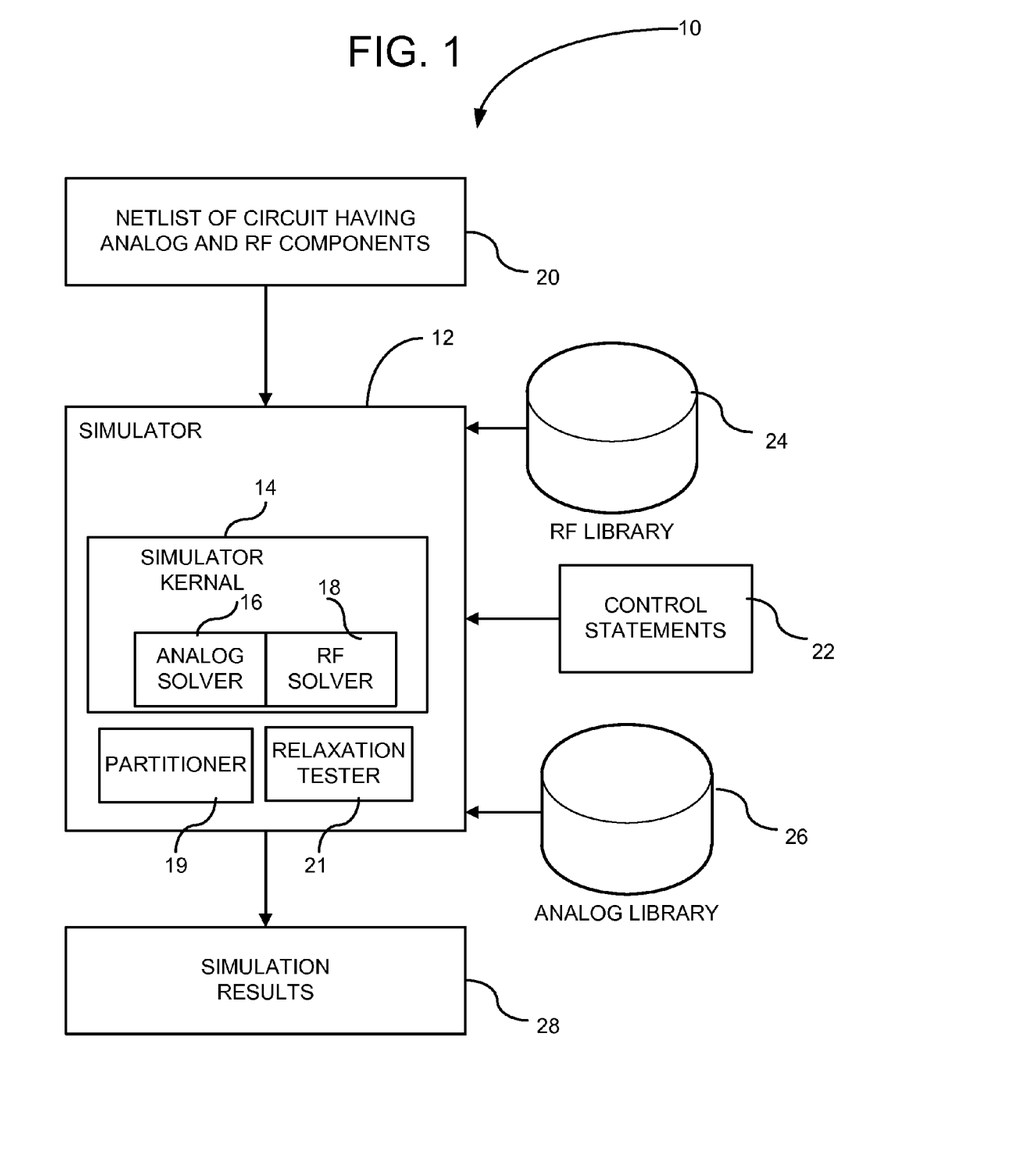
FIG. 1 shows a mixed-domain simulator system used to simulate circuits including both analog and RF signals.

FIG. 1 shows a mixed-domain analog/RF simulator environment 10 including a simulator 12. The simulator 12 has a single simulator kernel 14 able to simulate both analog and RF signals in a single simulation flow. This concept is shown diagrammatically by including within the simulator kernel 14 separate analog and RF solvers 16, 18, respectively. The analog solver 16 formulates non-linear equations for the circuit to solve for an unknown waveform V(t), where V(t) is a time-domain signal. RF solver 18 is used to perform modulated steady-state analysis of RF signals. For modulated steady-state analysis, the RF solver might represent the RF signal using the following formula:

$$v(t) = \sum_{k=-K}^{K} V_K(t) e^{j\omega_k(t)t},$$

that includes both time aspects and frequency aspects. The simulator may also include a partitioner 19 to divide the circuit into modules that are separately solved to make the system of non-linear equations manageable and, thereby, allowing faster simulation time. A relaxation tester 21 performs one-step relaxation to test convergence of the solved partitions. Any desired relaxation method may be used, such as that disclosed in U.S. Pat. No. 4,791,593 to Bernard Hennion, which is hereby incorporated by reference.

A circuit description that includes components used with both analog and RF signals is provided to the simulator 12 through a netlist 20, which may take many forms. For example, the netlist may be a transistor-level description, which is a full netlist of the physical circuit containing detailed architectural and parasitic information or the netlist may be derived from an analog behavioral language (e.g., Verilog-AMS or VHDL-AMS). In any event, the netlist normally contains a list of components in the circuit, the parameter values, and connection node names. The simulator 12 also receives control statements 22 directly in the netlist or through a user interface (not shown). The control statements may be used in a variety of ways, such as allowing the user to control the type of simulation to be performed, the stimuli to be used, which signals are displayed, partitioning, etc.

The simulator 12 uses the netlist 20, the control statements 22, and one or more databases, such as an RF library 24 and analog library 26, to simulate the circuit and provide simulation results 28 in any desired form, such as on a display, in an output file, etc. Although two databases 24, 26 are shown, they may be combined or further subdivided.

Figure 2:
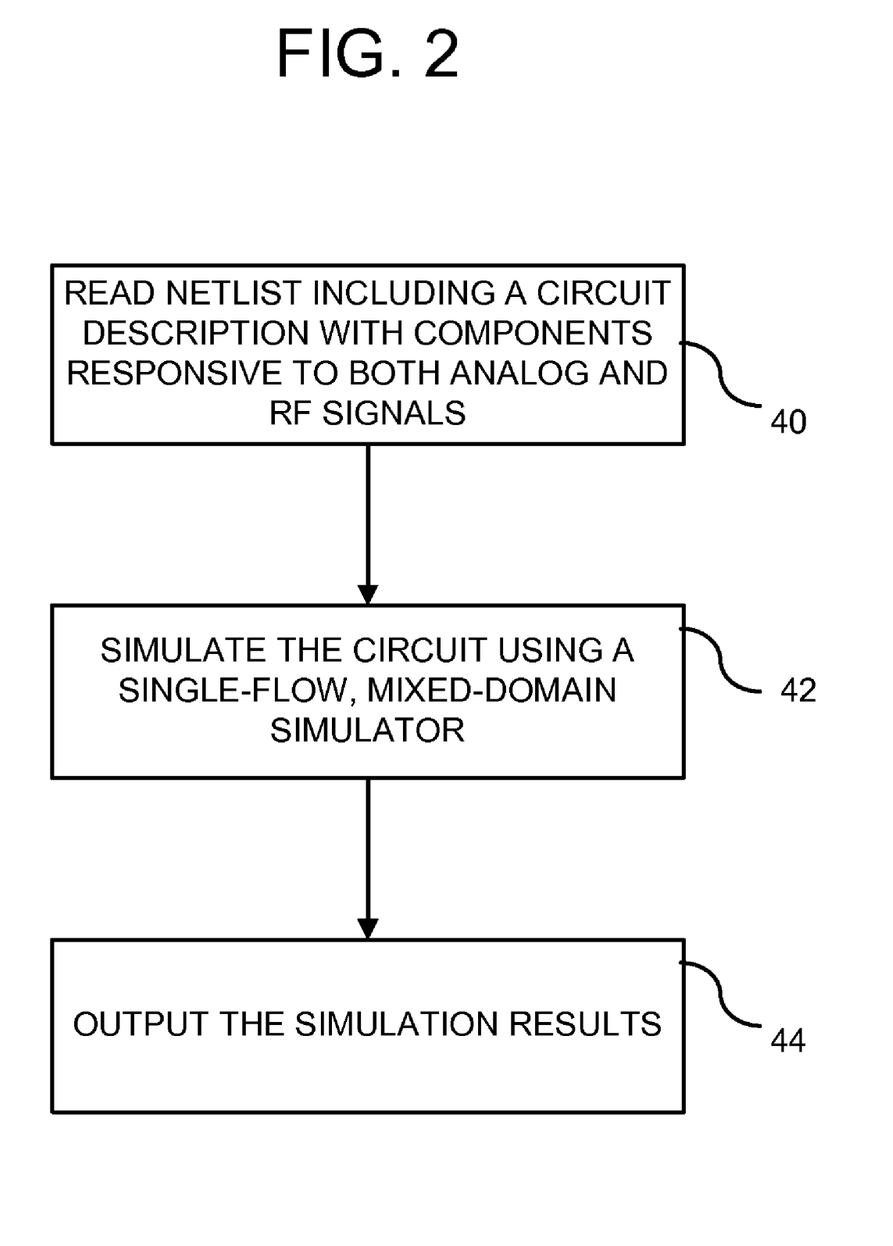
FIG. 2 is a flowchart of a method for simulating mixed-domain circuits according to the invention.

FIG. 2 is a flowchart of a method for performing the simulation using the simulator 12 of FIG. 1. In process block 40, the simulator 12 reads the netlist that includes a circuit description containing both components used with analog signals and components used with RF signals. In process block 42, the simulator 12 simulates the circuit using a single-flow simulation that is used to verify the correct operation of the circuit. The single-flow simulation is performed by a single simulator kernel 14 (FIG. 1) and as further described below. In process block 44, the simulation results are outputted in any desired manner. For example, the simulation results of the RF signals may be displayed at the same time as the simulation results of the analog signals, wherein both the RF and analog signals were obtained during the same simulation flow. The single simulation flow allows for an interrelated solution where solutions of analog partitions affect the analysis of RF partitions and vice versa.

Figure 3:
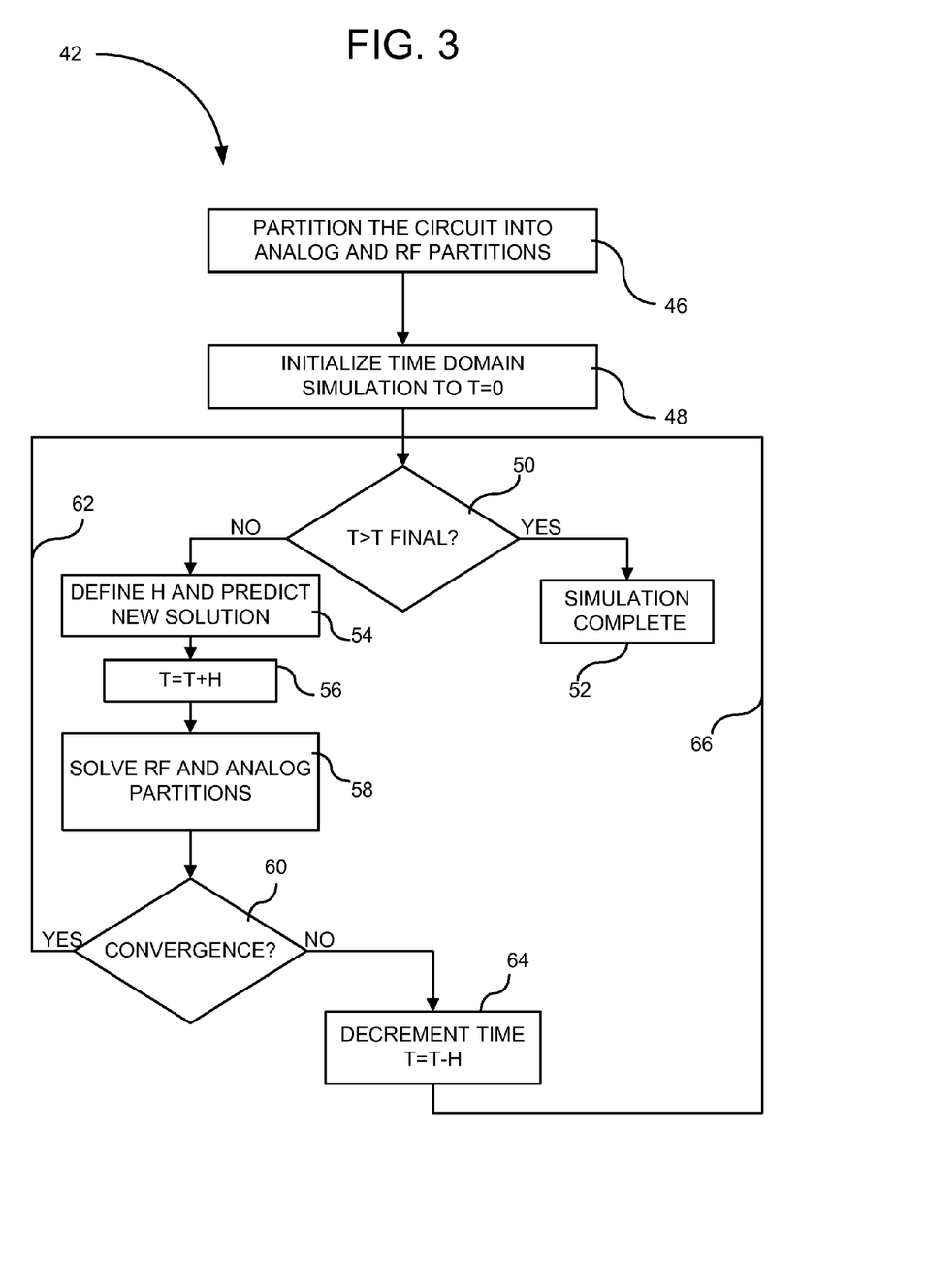
FIG. 3 is a detailed flowchart of a method for simulating mixed-domain circuits.

FIG. 3 shows a more detailed flowchart of process block 42 (FIG. 2) for simulating a mixed-domain analog and RF circuit using the simulator 12. In process block 46, the circuit is partitioned into analog and RF modules. Further details of the partitioning process are described below in relation to FIGS. 5 and 6. In process block 48, the time variable T is initialized to zero. The variable T stores the current time being evaluated because the simulator 12 simulates based on variable increments of time H. Thus, process block 48 initializes T to start at the beginning. The single simulation flow then continues with a loop that starts at decision block 50, where the variable T is analyzed to determine if a stopping point of TFINAL is reached (TFINAL being the maximum time to be simulated as defined by the user). If so, the simulation is complete as shown at process block 52. Otherwise, the simulation continues at process block 54 where the time increment H is defined and a solution predicted. For example, a solution is extrapolated based on the chosen time increment H and one or more of the previous time simulation passes. If a resolution failed to converge, a smaller time increment can be used to increase the probability of convergence. At process block 56, the current time T is incremented by H. At process block 58, the RF and analog partitions are solved as described further below in relation to FIG. 4. At process block 60, a check is made for convergence. If there is convergence, the loop is continued as shown by arrow 62. Otherwise, the current time T is decremented at process block 64 and the process continues as shown by arrow 66. In the case of non-convergence, process block 54 will take into account that convergence was not successful and will modify H accordingly to increase the probability of convergence.

Figure 4:
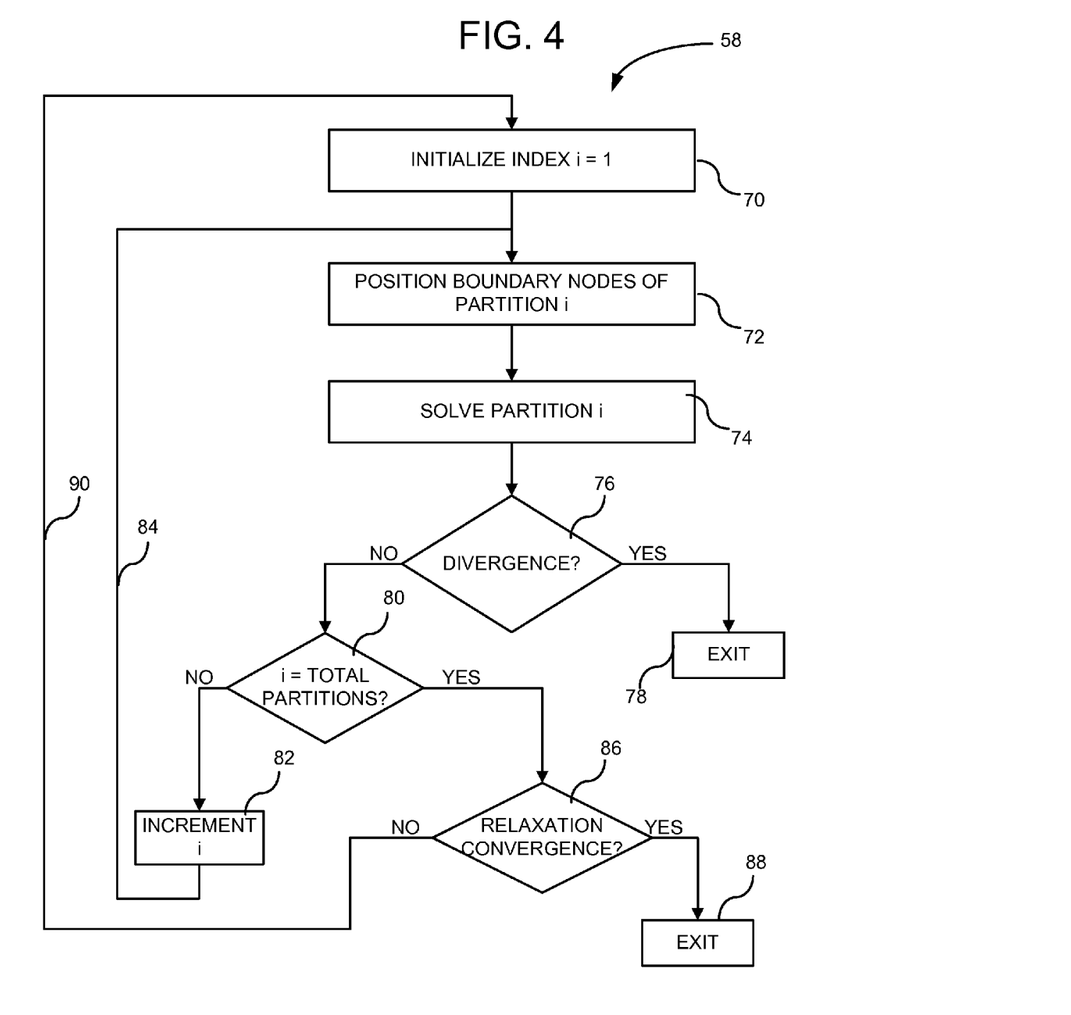
FIG. 4 is a detailed flowchart of a method for solving RF and analog partitions of FIG. 3.

FIG. 4 shows further details of process block 58. At process block 70, a loop index i is set to one. In process block 72, an RF or an analog partition designated by index i has its boundary nodes positioned. The boundary node positioning specifies the boundary node values as fixed values or spectrums to the partition so that the partition can be solved using Newton-Raphson techniques. In the case of a node that is an analog node coupled to either an analog partition or an RF partition, the boundary node is set to a fixed value. In the case of a node that is an RF node coupled to an RF partition, the boundary node is set to a fixed spectrum defined by the $V_K$ (k=−K to K). In the case of a node that is an RF node coupled to an analog partition, the boundary node may be set in at least two ways: In a first fast mode it is set to $V_0(t)$ (obtained by limiting K to 0 in the summation $$v(t) = \sum_{k=-K}^{K} V_K(t) e^{j\omega_k(t)t} \Bigg).$$

In a more accurate mode, it is set to v(t)

$$v(t) = \sum_{k=-K}^{K} V_K(t) e^{j\omega_k(t)t},$$

computed over the entire summation). In process block 74, with the boundary nodes held fixed, the partitions are solved using Newton-Raphson or other well-known techniques. If the partition is an RF partition, the simulator 12 uses the RF solver portion 18 of the simulator kernel 14 to solve the system of equations defined by $F(V_K)=0$, as is well known in the art. Alternatively, if the partition is an analog partition, the analog solver portion 16 of the simulator kernel 14 is used to solve the system of equations defined by $F(v)=0$. In any event, there is an interrelationship between solving of the RF partitions and the analog partitions through the boundary nodes and boundary components.

At decision block 76, divergence is checked. If there is divergence, then the loop exits at 78 and the process continues at decision block 60 of FIG. 3. Thus, returning briefly to FIG. 3, convergence at 60 should also be answered in the negative when there is divergence at 76 in FIG. 4. Therefore, the time is decremented (block 64), and a new (shorter) time increment is chosen at block 54 to provide a higher probability of convergence.

Returning to FIG. 4, if there was not divergence at decision block 76, then a check is made at decision block 80 whether all of the partitions have been solved. If no, then index i is incremented (process block 82) and the loop continues as shown by arrow 84. If in decision block 80, all of the partitions have been solved, then overall convergence is checked by relaxation tester 21. Decision block 86 determines whether there was convergence and, if yes, then the routine is exited at 88. If there is no convergence, then the process is repeated as shown by arrow 90.

Figure 5:
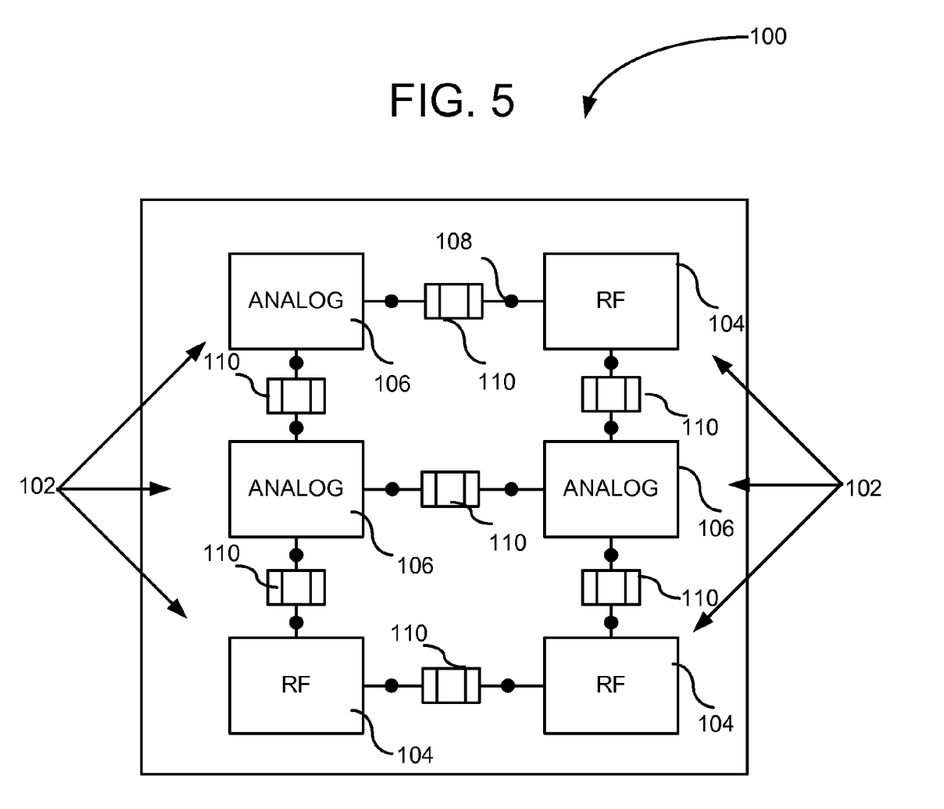
FIG. 5 shows an example circuit partitioned into analog and RF sections.

FIG. 5 is an example circuit 100 divided into partitions shown generally at 102. Although only a small number of partitions are shown, there may be any number of partitions based on the circuit. The partitions 102 are divided into two general sets of nodes and components: RF 104 and analog 106. Boundary nodes (shown by dots such as shown at 108) and boundary elements 110 are shown between the partitions 102. Thus, a partition is a set of nodes and a set of components, wherein any given node belongs to only one partition. A boundary node is a node connected to a (boundary) component that is connected to at least one node in another partition. A boundary component is a device connected to boundary nodes and is shared by at least two partitions.

Figure 6:
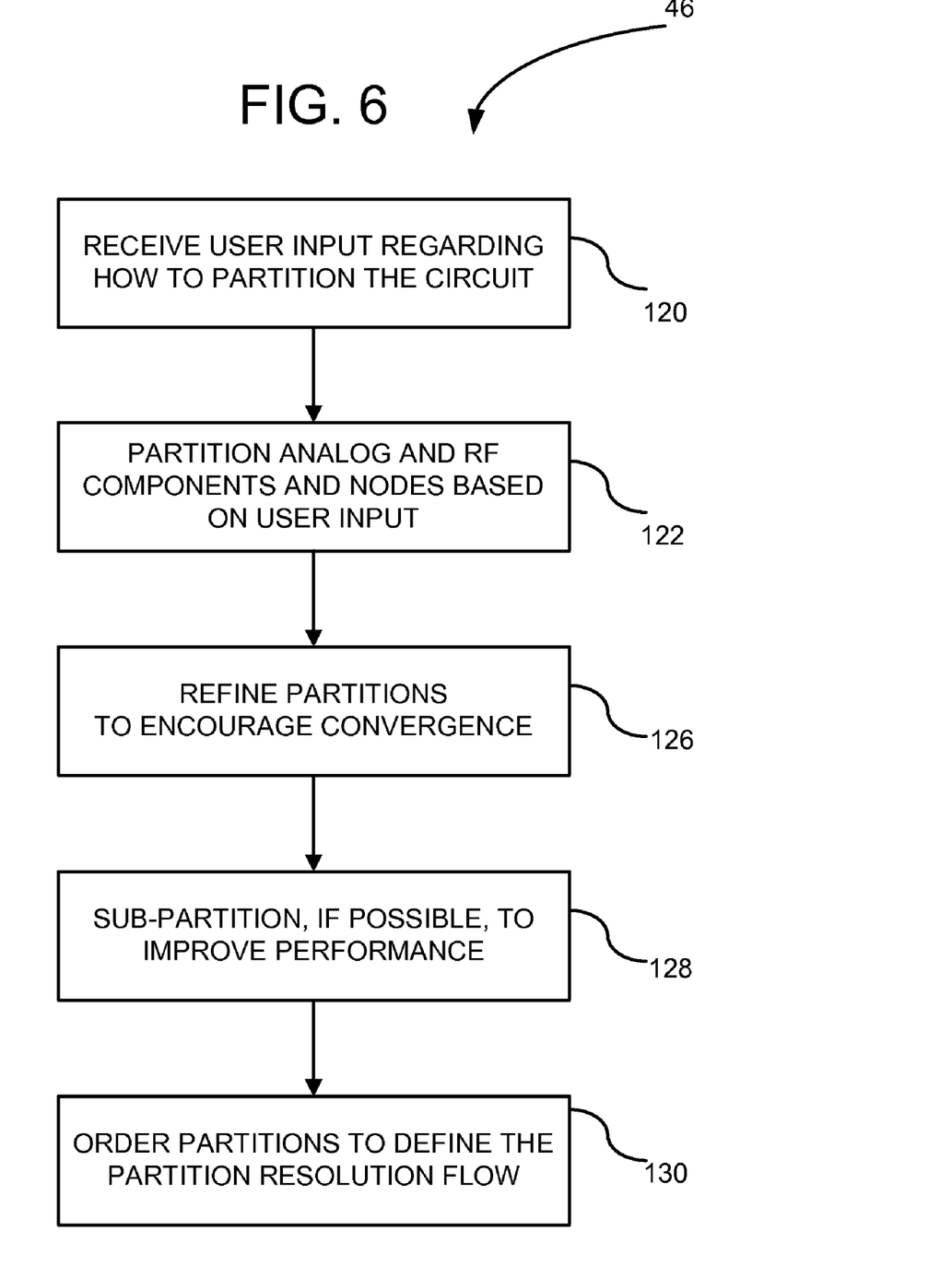
FIG. 6 provides a flowchart of a method for partitioning.

FIG. 6 shows a flowchart expanding on process block 46 of FIG. 3. In process block 120, user input is received regarding how to partition the circuit. The user can provide control statements 22 about how the circuit should be partitioned generally. However, the simulator refines this information to create the actual partitions, such as which RF nodes are placed in which RF partition, etc. In process block 122, the simulator partitions the analog and RF components and nodes based on the user input. In process block 126, the partitioner 19 examines and automatically refines the partitions (and nodes) to encourage convergence. The simulator 12 uses information in the netlist, the user-provided information, and its own refinements to form a partitioned circuit 100, such as shown in FIG. 5. In process block 128, the simulator 12 may create further sub-partitions to speed-up simulation. Finally, in process block 130, the partitions 102 are ordered to define the resolution flow. Generally, the partitions are ordered to follow signal flow through the circuit. For example, a partition coupled to an input signal may be first in order. In any event, the partition order corresponds to the index number i of FIG. 4.

Figure 7:
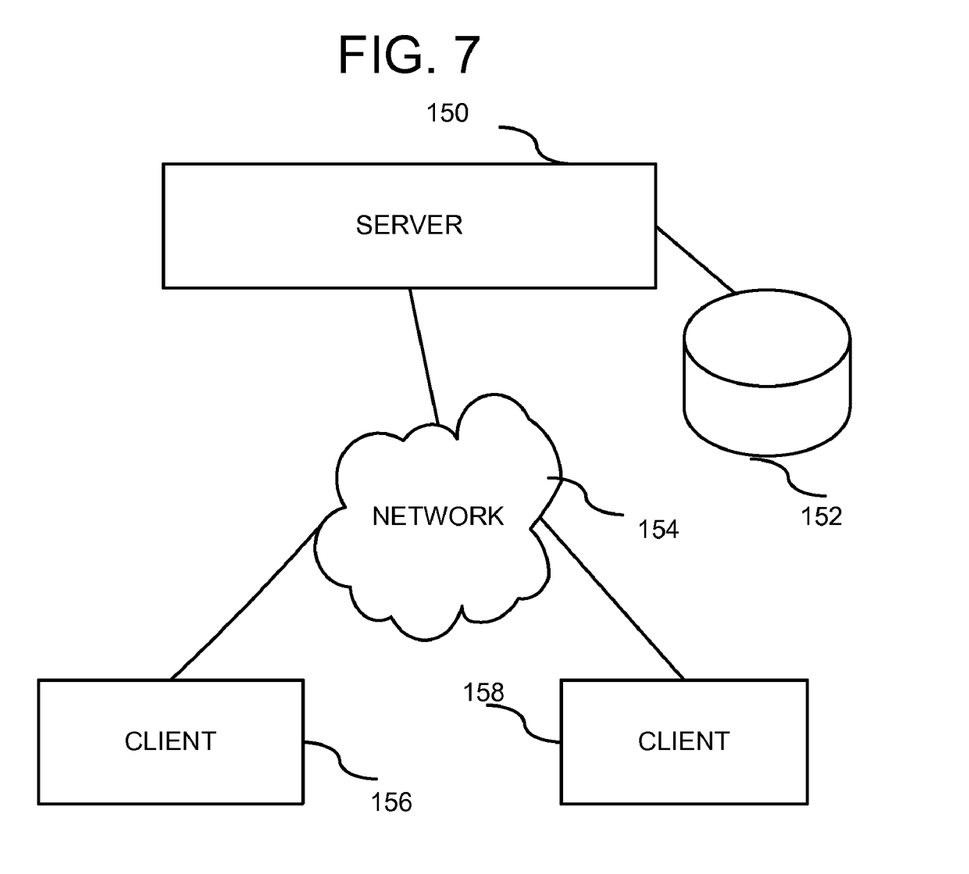
FIG. 7 shows a network environment in which the system may be used.

FIG. 7 shows that portions of the system 10 may be applied to a distributed network, such as the Internet. For example, a server computer 150 may have an associated database 152 (internal or external to the server computer). The server computer is coupled to a network shown generally at 154. One or more client computers, such as those shown at 156 and 158, are coupled to the network to interface with the server computer using a network protocol.

Figure 8:
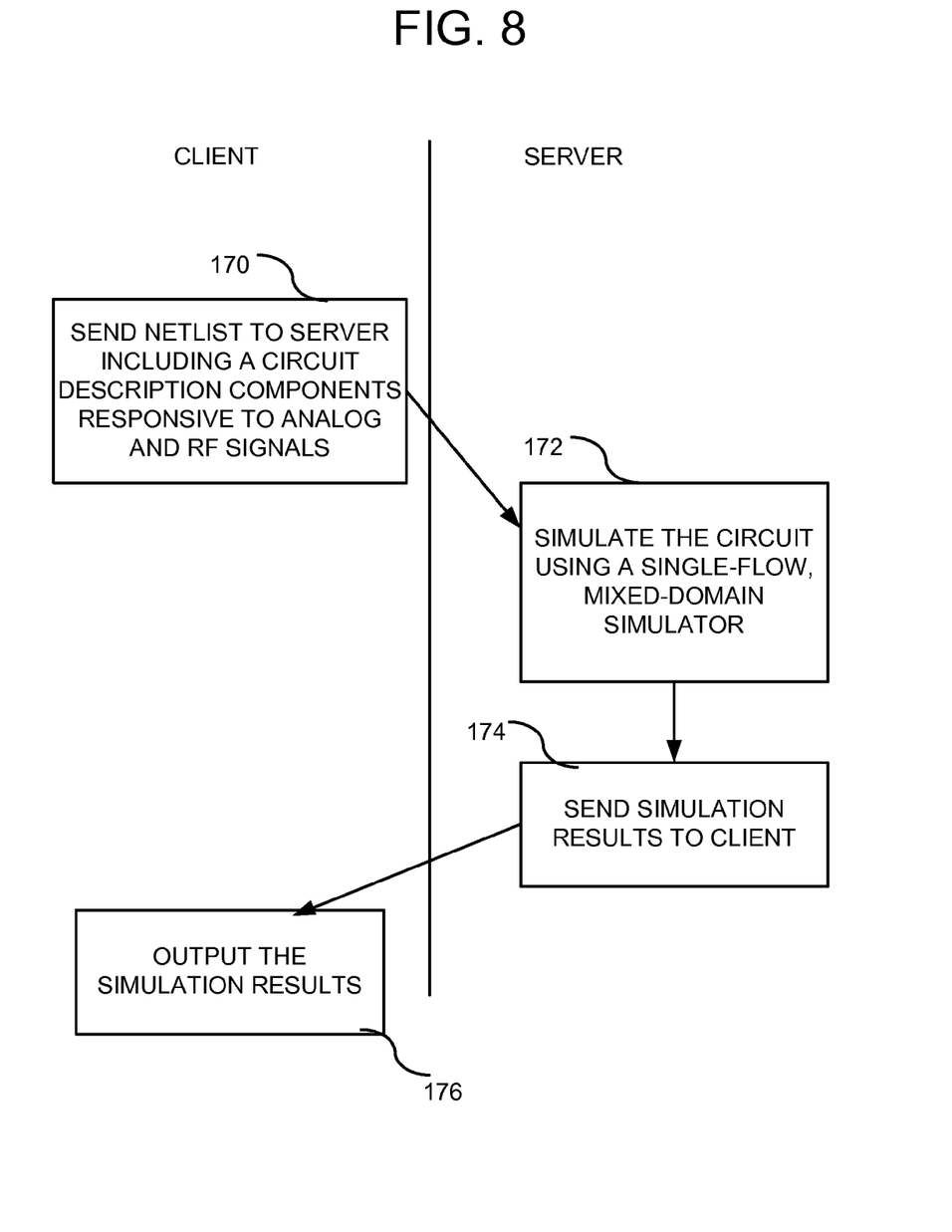
FIG. 8 shows a flowchart of a method for simulating over the network of FIG. 7.

FIG. 8 shows a flow diagram using the method on the network of FIG. 7. In process block 170, the netlist is sent from a client computer, such as 156, to the server computer 150. In process block 172, the circuit described in the netlist is simulated using a single-flow, mixed-domain simulator 12. In process block 174, the results are returned to the client computer via the network 154. In process block 176, the client computer displays or otherwise provides the simulation results to the user.

Having illustrated and described the principles of the illustrated embodiments, it will be apparent to those skilled in the art that the embodiments can be modified in arrangement and detail without departing from such principles.

Although boundary components are shown as being connected to only two partitions, they may be connected to any desired number of partitions.

Although it is described that the user defines some information to control partitioning, the partitioning may be fully automated by the simulator. For example, the simulator can analyze whether an input stimulus is RF or analog and control partitioning based on that analysis. Additionally, the signal types at the boundary nodes can be used to define the partitioning.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

The invention claimed is:

1. A method of simulating a circuit, comprising:
   reading a description of the circuit that includes a list of components in the circuit and the interconnections between the components, the circuit including both a first set of nodes and components responsive to time-domain signals, including analog signals that are not modulated, and a second set of nodes and components responsive to time-frequency domain signals, which include RF signals, which are modulated; and
   in a single simulation flow, simulating the time-domain signals, which are not modulated, on the first set of nodes using a first set of non-linear equations and simulating the time-frequency domain signals, which are modulated, on the second set of nodes using a second set of non-linear equations;
   the single simulation flow including interrelately solving the first set of non-linear equations, and the second set of non-linear equations, until convergence, wherein the time-domain signals are analog signals included in at least one analog partition and the time-frequency domain signals are RF signals included in at least one RF partition and wherein a solution for simulation of the analog partition affects a solution for simulation of the RF partition.

2. The method of claim 1, further comprising:
   partitioning the circuit into at least one partition including one or more nodes and components from the first set and at least one partition including one or more nodes and components from the second set.

3. The method of claim 1, further comprising receiving user input controlling how to partition the circuit and automatically refining the partitions to provide a higher probability of convergence.

4. The method of claim 1, further comprising partitioning the circuit based on user input and automatically sub-partitioning the circuit to increase simulation speed.

5. The method of claim 4, wherein simulating comprises solving each of the partitions separately and performing relaxations over all of the solved partitions.

6. The method of claim 1, further comprising:
   partitioning the circuit into separate modules coupled together, with each module being associated with at least one boundary node external to the module;
   positioning a boundary node by specifying the boundary node to a fixed value or spectrum; and
   solving a partitioned module using the fixed value or spectrum assigned to the positioned boundary node.

7. The method of claim 1, wherein the time-domain signals are given by V(t) and the time-frequency domain signals are given by $$v(t) = \sum_{k=-K}^{K} V_K(t) e^{j\omega_k(t)t}.$$

8. The method of claim 1, further comprising receiving, on a server computer, the description from a client computer over a distributed network, simulating the description on the server computer, and returning results to the client computer over the distributed network.

9. The method of claim 1, wherein simulating comprises solving analog and RF partitions for each time step, and wherein the time step is automatically adjusted based on the simulation results of previous time steps and input stimuli.

10. A computer-readable storage having instructions thereon for performing the following method, the method comprising:
    reading a description of the circuit that includes a list of components in the circuit and the interconnections between the components, the circuit including both a first set of nodes and components associated with non-modulated analog signals, and a second set of nodes and components associated with modulated RF signals; and
    in a single simulation flow, simulating the non-modulated analog signals on the first set of nodes using a first set of non-linear equations and simulating the modulated RF signals on the second set of nodes using a second set of non-linear equations;
    in the single simulation flow, interrelately solving the first set of non-linear equations, and the second set of non-linear equations, until convergence;
    partitioning the circuit into at least one partition including one or more nodes and components from the first set and at least one partition including one or more nodes and components from the second set, and wherein a solution for simulation of the first set of nodes affects a solution for simulation of the second set of nodes.

11. The method of claim 10, further comprising receiving user input controlling how to partition the circuit and automatically refining the partitions to provide a higher probability of convergence.

12. The method of claim 10, further comprising partitioning the circuit based on user input and automatically sub-partitioning the circuit to increase simulation speed.

13. The method of claim 10, wherein simulating comprises solving each of the partitions separately and performing relaxations over all of the solved partitions.

14. The method of claim 10, further comprising:
    partitioning the circuit into separate modules coupled together, with each module being associated with at least one boundary node external to the module;
    positioning a boundary node by specifying the boundary node to a fixed value or spectrum; and
    solving a partitioned module using the fixed value or spectrum assigned to the positioned boundary node.

15. The method of claim 10, wherein the non-modulated analog signals are defined by V(t) and the modulated RF signals are defined by $$v(t) = \sum_{k=-K}^{K} V_k(t) e^{j\omega_k(t)t}.$$

16. The method of claim 10, wherein simulating comprises solving analog and RF partitions for each time step, and wherein the time step is automatically adjusted based on the simulation results of previous time steps and input stimuli.

* * * * *